Figure 1:
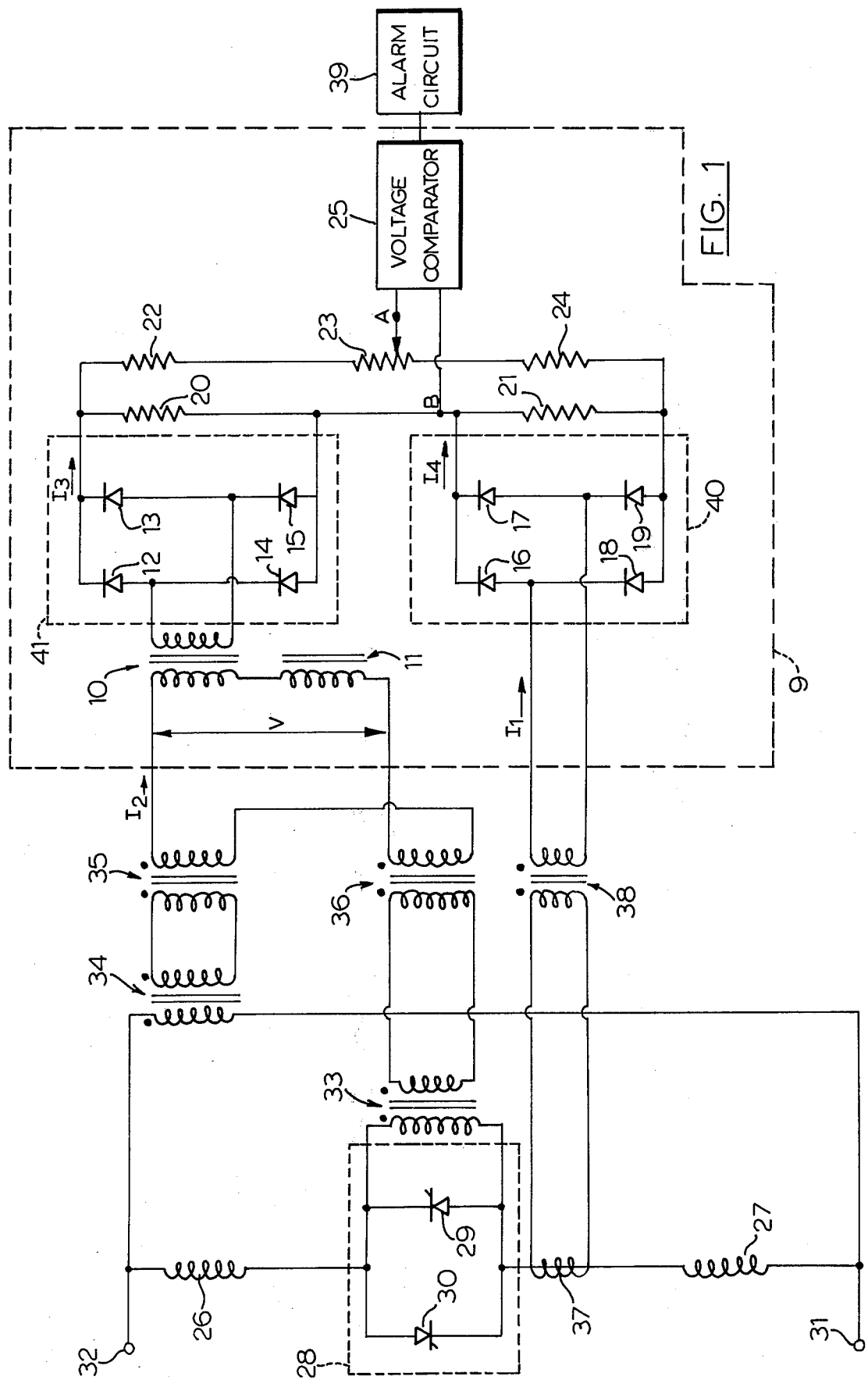

United States Patent [19]
Beak et al.

[11] 3,973,185
[45] Aug. 3, 1976

[54] CIRCUIT FOR MONITORING THE INDUCTANCE OF AN INDUCTIVE LOAD TO INDICATE OCCURRENCE OF A FAULT

[75] Inventors: John H. Beak; Gordon W. Speer, both of Peterborough, Canada

[73] Assignee: General Electric Company, Phila., Pa.

[22] Filed: Nov. 13, 1974

[21] Appl. No.: 523,281

[30] Foreign Application Priority Data
June 24, 1974 Canada.................................. 203211

[52] U.S. Cl................................ 324/51; 317/27 R
[51] Int. Cl.²........................................ G01R 31/02
[58] Field of Search............ 324/51, 127, 140, 57 R, 324/59, 126, 142; 317/27 R, 36 D; 340/253 R, 253 A

[56] References Cited
UNITED STATES PATENTS

| | | | |
|---|---|---|---|
| 2,808,566 | 10/1957 | Douma | 324/127 |
| 2,879,472 | 4/1959 | Worden | 324/64 X |
| 3,202,877 | 8/1965 | Perrault | 317/27 R X |
| 3,281,681 | 10/1966 | Stevenson | 324/57 R X |
| 3,284,705 | 11/1966 | Dobson | 324/57 R |
| 3,340,434 | 9/1967 | Riebs | 317/36 D |
| 3,519,910 | 7/1970 | Pfaff et al. | 317/27 R X |

*Primary Examiner*—Gerard R. Strecker
*Attorney, Agent, or Firm*—J. Wesley Haubner

[57] ABSTRACT

A circuit for monitoring the inductance of an inductive load controlled by phase-operated thyristor devices or similar devices. One embodiment of the invention comprises a first current sensitive device to produce a signal proportional to the current flowing through the load, a voltage sensitive device to produce a signal proportional to the voltage across the load, an inductor driven by the voltage signal and a second current sensitive device for producing a signal proportional to the current flowing through the inductor. The first current signal is then rectified and fed to a voltage divider consisting of five series connected resistors. The second current signal is also rectified and fed to the same voltage divider. A comparator is connected to the aforementioned voltage divider and senses any voltage change on the voltage divider due to a change in the ratio of the second current signal to the first current signal (or the inverse ratio) and thus in effect, senses any change in the impedance of the load.

2 Claims, 2 Drawing Figures

CIRCUIT FOR MONITORING THE INDUCTANCE OF AN INDUCTIVE LOAD TO INDICATE OCCURRENCE OF A FAULT

This invention relates to inductance monitoring devices, and particularly to a static device for monitoring the change in an inductive load which is controlled by a switching device such as a phase controlled thyristor switch.

The use of impedance monitoring as a means for determining the condition of a load is well known. If a load, such as an inductor or reactor is connected across an AC voltage source it is a relatively simple matter to measure the RMS voltage across the load and the RMS current through the load and to use these two measurements to provide an indication of the impedance. If the load is of the normally constant impedance type, any change in impedance indicates that there is a fault in the load (e.g. a shorted turn in a reactor). This information can then be used to provide a visual or audible indication of a fault or to instigate some protective action such as disconnecting the load.

When devices such as reactors are employed in large power circuits the detection of faults is of great importance since a shorted turn can cause overheating which in turn can easily lead to a fire. Consequently it is extremely important to monitor the state of these reactors. Impedance monitoring provides a relatively easy, accurate and sensitive means of doing this if the load is connected directly across the power source.

The use of impedance monitoring, however, has so far been limited to loads directly coupled to the power source. When phase-controlled thyristor swithces or similar devices are used to control the load, the present impedance monitoring methods have not been applicable.

Accordingly, it is an object of the present invention to provide a device for making inductance measurements when a switching device is employed with an inductive load.

Briefly stated, one embodiment of the invention comprises a first current sensitive device to produce a signal proportional to the current flowing through the load, a voltage sensitive device to produce a signal proportional to the voltage across the load, an inductor driven by the voltage signal and a second current sensitive device for producing a signal proportional to the current flowing through the inductor. The first current signal is then rectified and fed to a voltage divider consisting of five series connected resistors. The second current signal is also rectified and fed to the same voltage divider. A comparator is connected to the aforementioned voltage divider and senses any voltage change on the voltage divider due to a change in the ratio of the second current signal to the first current signal (or the inverse ratio); this is in effect a device for detecting any changes in the load inductance.

Figure 2:
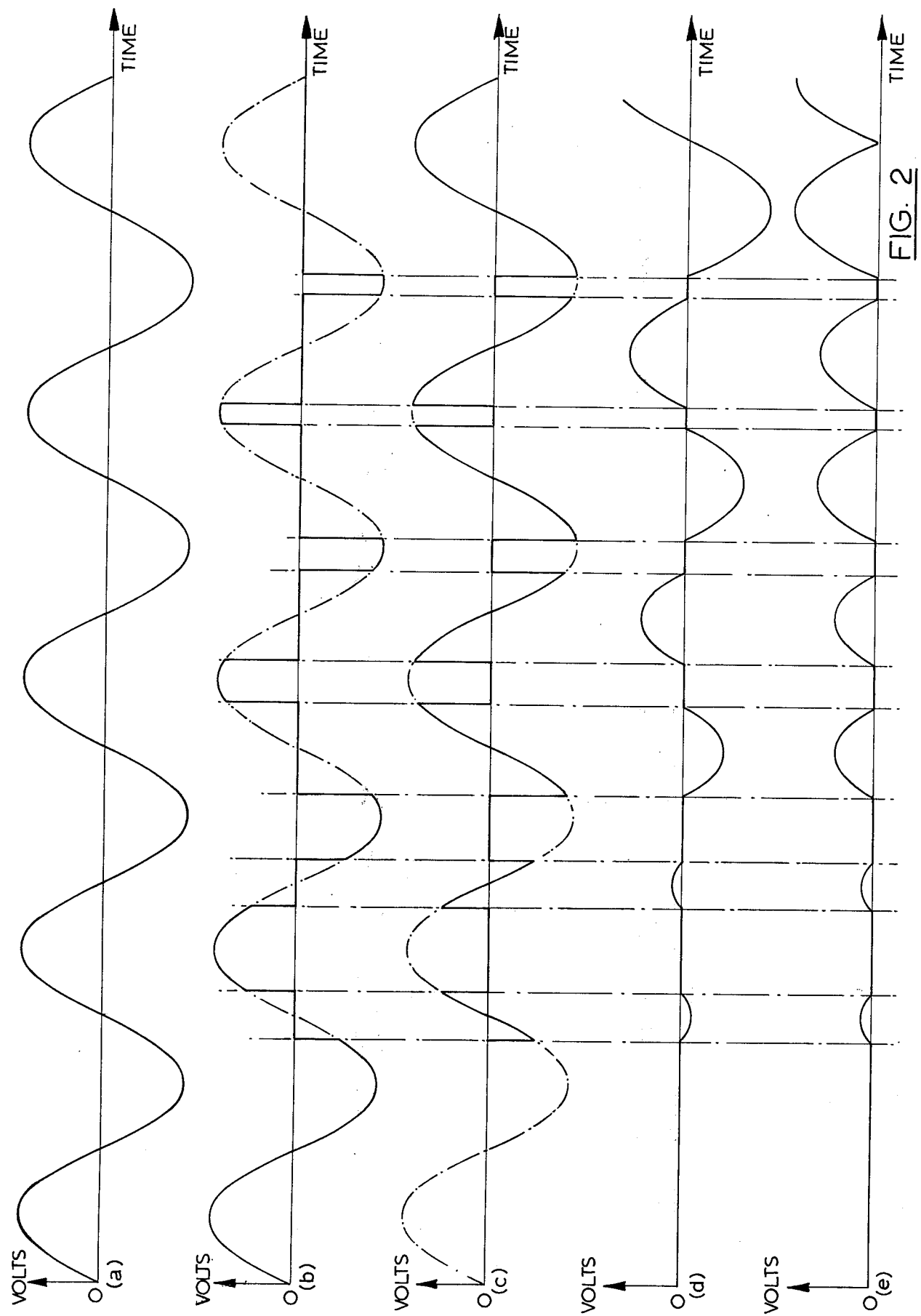

The invention will now be described in more detail with reference to the accompanying drawings, in which:

FIG. 1 depicts a simplified schematic of one embodiment of the invention connected to an inductive, thyristor-controlled load; and FIG. 2 consists of five graphs showing some of the waveforms of FIG. 1.

FIG. 1 depicts one embodiment of the present invention by the dotted box 9 wherein current transformer 10 and inductor 11 are used to input a voltage signal V derived from an inductive load (i.e., inductors 26 and 27), and the rectifier 40, consisting of diodes 16, 17, 18 and 19, inputs a signal derived from the current through the same inductive load. FIG. 1 shows an application for a single phase load, but this invention can be adapted for use with a multi-phase load by simply applying the invention described herein to each phase of the load.

A typical induction load (inductors 26 and 27) with an SCR switch 28 and the connections for one method of obtaining the current and voltage signals are also shown in FIG. 1. The load consists of inductor 26 and inductor 27 connected in series by an SCR switch 28 which consists of SCR's 29 and 30 arranged in an inverse parallel relationship. Power is applied to the load at terminals 31 and 32 and the SCR's 29 and 30 are phase-controlled according to well known means.

The primary winding of transformer 33 is connected across the SCR switch 28 to provide an indication of the voltage across the switch 28. When the switch 28 is turned fully on, the voltage across it will be effectively zero, and when the switch 28 is turned off, the voltage across it will be the same as the voltage applied across terminals 31 and 32. The primary winding of transformer 34 is connected directly across the terminals 31 and 32 which supply the power; accordingly, transformer 34 produces a signal related to the supply voltage. The secondary winding of transformer 34 is connected to the primary winding of transformer 35 and the secondary winding of transformer 33 is connected to the primary winding of transformer 36. The secondary windings of transformers 35 and 36 are connected in series, in such a way that their voltages tend to cancel each other and produce the difference between the two voltage signals. This produces a voltage signal V related to the difference between the applied voltage across terminals 31 and 32 and the voltage across the switch 28; this is in effect the voltage across the load i.e., inductors 26 and 27. The foregoing method for obtaining the voltage across the load is well known and alternative methods can also be used. In the method just described the transformers 35 and 36 were used to ensure a high degree of isolation between the sensing transformers 33 and 34 and the invention. The series connected secondaries of transformers 35 and 36 are then series connected to one input of the invention, namely the primary winding of current transformer 10 connected in series with the inductor 11.

Current transformer 37 is used to produce a signal related to the current flowing through the inductors 26 and 27 and it in turn is connected to the primary winding of transformer 38; the secondary winding of transformer 38 is connected to another input of the invention, namely the anodes of diodes 16 and 17 of the rectifier 40.

The inductor 11 in the present invention is necessary if an inductive load is to be monitored since the current of the inductive load will lag the voltage across the load by approximately 90°. Accordingly, it is necessary to have the inductor 11 in order to introduce a lag of approximately 90° in the current $I_2$, representing the voltage across the load, so that it can be compared with the current signal $I_1$. The inductor 11 causes the current $I_2$ flowing through itself, the secondary windings of transformers 35 and 36 and the primary winding of current transformer 10 to lag the voltage V by approximately 90° and thus become approximately in phase with the current signal $I_1$; this then allows for easier comparison of the two signals (i.e. between $I_1$ and $I_2$).

The output from current transformer 10 is then rectified by the rectifier 41 consisting of diodes 12, 13, 14 and 15. This results in an output current $I_3$ flowing from the rectifier 41 as shown in the Figure. The current signal $I_1$ is similarly rectified by the rectifier 40 and a resultant current $I_4$ is produced flowing as indicated in the Figure. Both currents $I_3$ and $I_4$ are approximately in phase with each other.

The rectified voltage signal V (i.e., now current $I_3$) is applied to resistor 20 and the rectified current signal $I_1$ (i.e., now current $I_4$) is applied to resistor 21. As shown in the Figure, resistors 20 and 21 are connected in series, and together with the series connection of resistors 22, 23 and 24 they form a voltage divider network.

A voltage comparator 25 is connected across a sliding contact on resistor 23 (point A) and the junction of resistors 20 and 21 (point B). The resistor 23 is adjusted until the comparator 25 shows a voltage difference of zero between the points A and B. If there should be a change in the impedance of the load, such as some shorted turns in an inductor, the current through the load would increase with no appreciable change in the applied voltage. As a result, the current signal $I_1$ would increase relative to the voltage signal V, as would $I_4$ relative to $I_3$, and the voltage comparator 25 would no longer detect a zero voltage difference between points A and B; instead, point A would go negative relative to point B. The comparator 25 detects this difference and is used to operate subsequent equipment such as an alarm, as indicated by the alarm circuit 39.

Similarly, if the inductance of the load were to increase (e.g. an open circuit) the current signal $I_1$ would decrease relative to the voltage signal V, as would $I_4$ relative to $I_3$ and there would no longer be a zero voltage difference between points A and B; instead, point A would go positive relative to point B, and the comparator 25 would act in a similar fashion to that previously described for a non-zero voltage difference between points A and B.

FIG. 2 shows some of the waveforms and their phase relationships as found in FIG. 1. FIG. 2a shows the supply voltage applied across the terminals 31 and 32 in FIG. 1. FIG. 2b shows the voltage across the SCR switch 28 of FIG. 1 as detected by transformer 33 of the same Figure. As can be seen from FIG. 2b, the SCR switch 28 is initially (at the left of the Figure) in the off state and accordingly the full voltage applied to terminals 31 and 32 appears across the switch 28. Successive cycles show the switch 28 being turned on for portions of the cycle which lengthen progressively until the switch 28 completely on and the voltage across it becomes zero, as shown by the right side of FIG. 2b.

FIG. 2c shows the voltage across the load of FIG. 1, i.e., the inductors 26 and 27. It is derived by subtracting the voltage across the switch 28 (see FIG. 2b) from the applied voltage across terminals 31 and 32 (see FIG. 2a). FIG. 2d shows the current flowing through both the switch 28 and the load (i.e., reactors 26 and 27). The amount of current increases as the switch 28 is turned on for longer and longer portions of a cycle, until eventually the switch 28 is fully on and accordingly the current is an approximately full sine wave as indicated at the right side of FIG. 2d. FIG. 2e shows the waveform of the currents $I_3$ and $I_4$. Both these currents have the same shape and are approximately in phase with each other; they may differ in magnitude however, depending on circuit values. They also increase in magnitude from the left of the Figure to the right, as the SCR switch 28 is turned on for progressively longer portions of a cycle.

While this invention has been described with particular reference to a switched load, it can also be used equally well with a non-switched load, and can be applied to any number of phases.

What we claim as new and desire to secure by letters patent of the United States is:

1. A circuit for sensing change in the inductance of an inductive load energized from controlled switching means which comprises:
   a. an inductor;
   b. first circuit means connected in circuit with the inductive load for generating a voltage proportional to the voltage applied across the inductive load and for applying said generated voltage across said inductor;
   c. a first current transformer responsive to current flowing through said inductor for generating a first signal proportional to the current flowing through said inductor;
   d. a second current transformer responsive to the current flowing through said inductive load for generating a second signal proportional to the current flowing through said inductive load;
   e. means for rectifying said first signal and applying unidirectional voltage proportional to said first signal across a first resistor;
   f. means for rectifying said second signal and applying unidirectional voltage proportional to said second signal across a second resistor, said first and second resistors being connected in series circuit relation;
   g. a voltage divider connected across said first and second resistors; and
   h. indicating means connected between a selected point on said voltage divider and the junction of said first and second resistors for detecting change in the inductance of said inductive load.

2. A circuit as recited in claim 1 wherein the first circuit means comprises:
   a. a first potential transformer having a primary winding connected across the power source; and
   b. a second potential transformer having a primary winding connected across the control switching means, the secondary windings of said first and second transformers being connected in voltage opposition to provide the voltage proportional to the voltage applied across said inductive load.

* * * * *